United States Patent [19]

Yoshida et al.

[11] Patent Number: 5,203,927
[45] Date of Patent: Apr. 20, 1993

[54] WASHING/DRYING METHOD WITH AN AQUEOUS SOLUTION CONTAINING SURFACTANT

[75] Inventors: Ichiro Yoshida; Hiroshi Iida; Shuzo Kawaashima, all of Nagano; Fukuji Kuroiwa, Shimotakai; Isamu Ito, Suzaka; Satoru Asanome; Toshiji Fujimori, both of Nagano, all of Japan

[73] Assignee: Fujitsu Limited, Kawasaki, Japan

[21] Appl. No.: 691,915

[22] Filed: Apr. 26, 1991

[30] Foreign Application Priority Data

May 1, 1990 [JP] Japan .................................. 2-116439

[51] Int. Cl.$^5$ ........................... B08B 3/00; B08B 5/04
[52] U.S. Cl. .................... 134/21; 134/22.14; 134/22.19; 134/26; 134/30; 134/37; 34/15
[58] Field of Search ............. 134/21, 26, 30, 31, 134/37, 40, 42, 22.14, 22.19; 34/15, 17, 34.5, 92

[56] References Cited

U.S. PATENT DOCUMENTS

| | | | |
|---|---|---|---|
| 1,250,496 | 12/1917 | Passburg | 34/17 X |
| 1,333,848 | 3/1920 | Jacobs | 34/17 X |
| 3,436,262 | 4/1969 | Crowe et al. | 134/10 |
| 3,615,310 | 10/1971 | Long | 34/15 X |
| 3,672,067 | 6/1972 | Emmett, Jr. et al. | 34/15 |
| 3,890,424 | 6/1975 | Davies | 34/15 X |
| 4,079,522 | 3/1978 | Ham | 134/30 X |
| 4,156,619 | 5/1979 | Griesshammer | 134/30 X |
| 4,318,749 | 3/1982 | Mayer | 134/37 X |
| 4,569,695 | 2/1986 | Yamashita et al. | 134/1 |
| 4,605,574 | 8/1986 | Yonehara et al. | 118/227 X |
| 4,842,687 | 6/1989 | Jucha et al. | 156/643 |
| 4,899,768 | 2/1990 | Yatabe | 134/66 |
| 4,902,350 | 2/1990 | Steck | 134/1 |

Primary Examiner—Theodore Morris
Assistant Examiner—Saeed T. Chandhry
Attorney, Agent, or Firm—Staas & Halsey

[57] ABSTRACT

A washing/drying method, comprising: dipping a material to be washed into an aqueous solution containing a surfactant having a water repellency so that at least one molecular layer of the water repellent surfactant is attached to the surface of the material to be washed; and then drying the material according to a known drying method such as vacuum drying, shaking off, blowing with gas and heating; or heating the material to be washed with steam at a temperature of less than 100° C. in an atmosphere reduced to a pressure such that the boiling point of water becomes less than 100° C.; and then drying the material according to a known drying method such as vacuum drying, shaking off, blowing with air, and heating.

6 Claims, 13 Drawing Sheets

WASHING/DRYING METHOD WITH AN AQUEOUS SOLUTION CONTAINING SURFACTANT

BACKGROUND OF THE INVENTION

1. Field of the Invention

The present invention relates to a washing/drying method and a washing/drying apparatus suitable for a thorough washing and/or drying of a material to be washed, such as precision electronic parts and precision electronic device parts, which must be thoroughly washed in the preparation steps thereof (i.e., thorough washing) and, from the standpoint of production efficiency or corrosion resistance, in which the washing liquid after washing must be removed by drying within a short time.

2. Description of the Related Art

In the prior art, the thorough washing in the preparation steps of precision parts and electronic device parts, where an attachment of contamination or dust can not be allowed, has been practiced primarily by washing with a fluorocarbon.

As the detergent for such a thorough washing, other than a fluorocarbon, there is known a solvent of the chlorine type such as trichloroethylene, but in the case of a metal product, the chlorine liberated in the washing step may be adhered and cause rusting, and in the case of a resin or rubber product, a deformation or dimensional change due to swelling may occur, and thus a problem arises of an adverse affect on the product. In contrast, in the case of a fluorocarbon, no such problem arises and drying occurs within a very short time, and therefore, washing with Freon 113 (fluorocarbon manufactured Mitsui Dupont Fluorochemical Co. Ltd.) has been employed in the prior art.

A fluorocarbon is harmless to human beings and animals but destroys the ozone layer, which has become a worldwide problem in recent years, and in the interests of environmental protection on a global scale the tendency is now toward completely abolishing the use of fluorocarbon. From such a standpoint, as an alternative to the washing method using a fluorocarbons, the development of a washing water which will not need regulation in the future is now under way.

The critical point of thorough washing, in addition to a thorough cleaning ability, is that the drying after washing can be carried out rapidly and thoroughly. Also, there should be no adverse affect on the material to be washed, as in the case of a detergent of the chlorine type mentioned above.

When washed with water, it is necessary to prevent the precision electronic part, constituted of a metal, from rusting. Since the boiling point of water is as high as 100° C., compared with that of Fron 113, which is 47° C., it is difficult to vaporize, and a part with a complicated shape or a blind tap hole can not be dried within a short time and without difficulty.

SUMMARY OF THE INVENTION

Accordingly, the objects of the present invention are to eliminate the above-mentioned disadvantages of the prior art and to efficiently perform thorough washing, and drying, after washing of the metallic or non-metallic material to be washed, without an adverse influence on the material, by a method other than one using a fluorocarbon.

Other objects and advantages of the present invention will be apparent from the following description.

In accordance with the present invention, there is provided a washing/drying method, comprising; dipping a material to be washed into an aqueous solution containing a surfactant having a water repellency so that at least one molecular layer of the water repellent surfactant is attached to the surface of the material to be washed, and then drying the material.

In accordance with the present invention, there is also provided a method of drying, after washing, comprising, dipping a material to be washed into an aqueous solution containing a surfactant having a water repellency so that at least one molecular layer of the water repellent surfactant is attached to the surface of the material to be washed; heating the material to be washed with steam at a temperature of less than 100° C., preferably 80° C. to 95° C. in an atmosphere reduced to a pressure such that the boiling point of water becomes less than 100° C., preferably 80° C. to 95° C.; and drying the material.

In accordance with the present invention, there is further provided a method of drying after washing, comprising: placing a material to be washed in a vacuum chamber; heating the material to be washed with steam at a temperature of less than 100° C., preferably 80° to 95° C. in an atmosphere reduced to a pressure such that the boiling point of water is less than 100° C., preferably 80° C. to 95° C.; and subsequently blowing a gas onto the material and, thereafter, vacuum drying the material.

In accordance with the present invention, there is further provided a method of drying after washing comprising: placing a material to be washed in a vacuum chamber; heating the material to be washed with steam at a temperature of less than 100° C., preferably 80° C. to 95° C., in an atmosphere reduced to a pressure such that the boiling point of water is less than 100° C., preferably 80° C. to 95° C.; subsequently blowing onto the material a gas, such as air; and thereafter, vacuum drying the material.

In accordance with the present invention, there is further provided a washing/drying apparatus having a water tank for receiving and holding therein an aqueous solution containing a surfactant having a water repellency, a shower washing device for removing superfluous surfactant attached to the material to be washed in said water tank, and a vacuum chamber for drying the material to be washed after shower washing. The vacuum kettle has a means of jetting steam so that the material to be washed can be heated with steam at a temperature of less than 100° C., preferably 80° C. to 95° C., in an atmosphere reduced to a pressure such that the boiling point of water is less than 100° C., preferably 80° to 95° C., and has a gas blowing means so that the water can be drained by blowing gas.

In accordance with the present invention, there is still further provided a drying apparatus comprising: a device for irradiating a material to be washed with electromagnetic wave irradiation device as a means for heating moisture adhered to the material, and at least one means selected from the group consisting of: (i) a gas blowing means for blowing gas on the material to be washed to remove water; (ii) a means for evacuating or reducing pressure applied to the material so that the moisture adhered to the material is removed; and (iii) a means of centrifuging the material so that the subject is spun-dried through centrifugation, all during or after heating by the electromagnetic wave-irradiation device.

In accordance with the present invention, there is still further provided a foam-suppressing apparatus comprising: an overflow vessel receiving an overflow from a washing vessel containing a surfactant-containing washing solution therein, arranged in a washing circulation system of a washing apparatus; and a valve means provided at a liquid outlet portion of the overflow vessel for controlling, the liquid level of the overflow vessel such that air is not included in the washing solution effluent from the overflow vessel.

BRIEF DESCRIPTION OF THE DRAWINGS

The present invention will be better understood from the description set forth below with reference to the accompanying drawings, in which.

DESCRIPTION OF THE PREFERRED EMBODIMENTS

Figure 1:
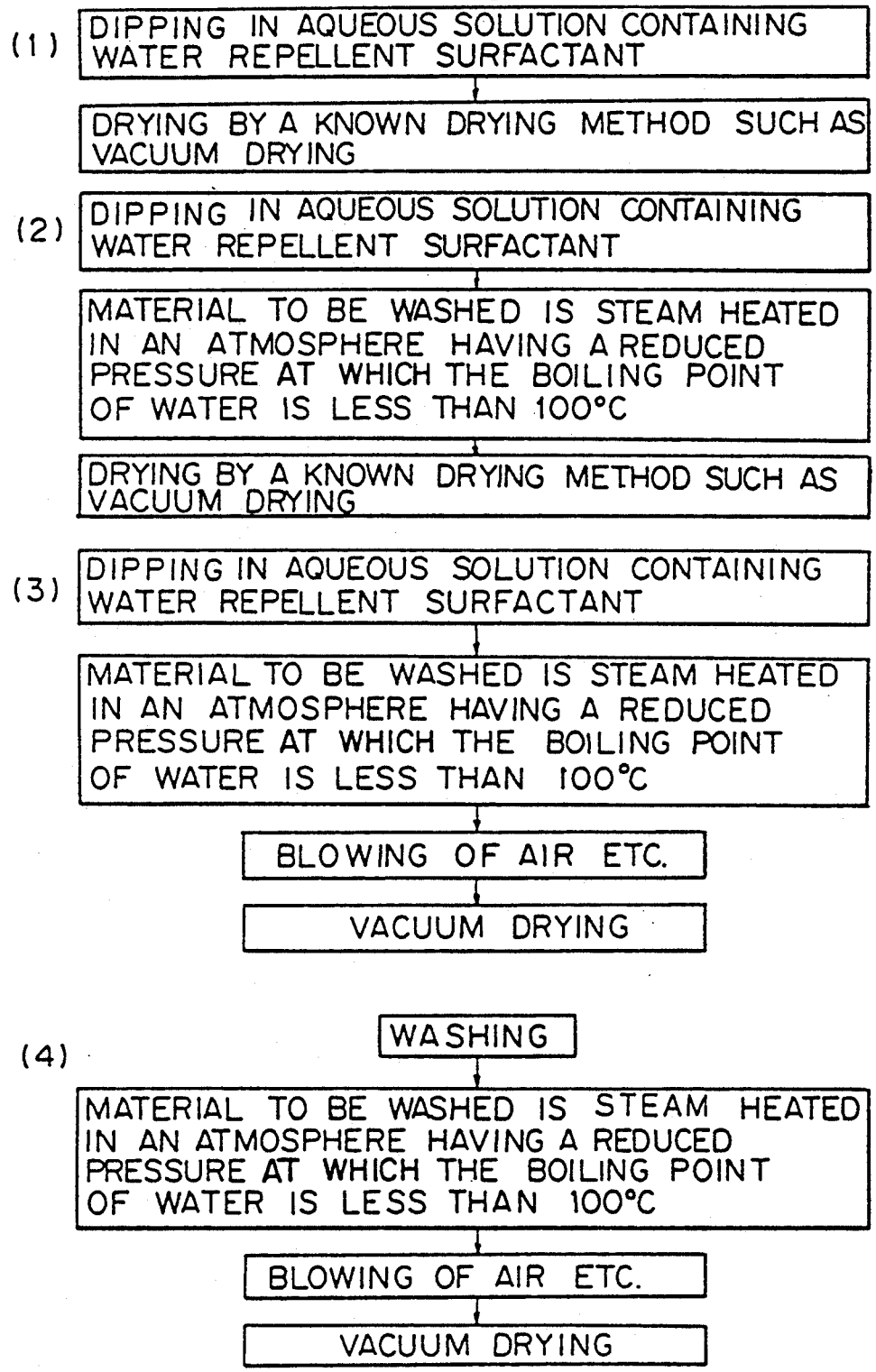
FIG. 1 is a diagram illustrating the basic principles and steps of the washing method and the method of drying after washing according to the present invention.

FIG. 1 is the diagram illustrating the basic principles and steps of the washing method and the method of drying after washing.

According to the first embodiment of one aspect of the present invention, when carrying out a washing/drying during the process of preparing parts or electronic parts, a material to be washed is dipped into an aqueous solution containing a surfactant having a water repellency so that at least one molecular layer of the water repellent surfactant is attached or adhered to the surface of the material to be washed, followed by drying according to a known drying method such as vacuum drying, shaking off (e.g., centrifuging), gas (e.g., air) blowing heating and others.

Since the aqueous solution of a water repellent surfactant also has a washing effect, washing also may be carried out by dipping the material to be washed in an aqueous solution of a water repellent surfactant, or it is sufficient to dip the material, washed in another step, in an aqueous solution of a water repellent surfactant so that at least one molecular layer of the water repellent surfactant is attached thereto.

Thus, after washing with an aqueous solution of a water repellent surfactant, or by dipping the material washed in another step into an aqueous solution of a water repellent surfactant, at least a molecular layer of the water repellent surfactant is attached to the surface of the material to be washed, before drying same according to a known drying method such as vacuum drying, shaking off, gas blowing, heating and others.

According to the second embodiment of the present invention, as described above, after dipping a material to be washed into an aqueous solution containing a surfactant having a water repellency so that at least one molecular layer of the water repellent surfactant is attached to the surface of the material to be washed, the material to be washed is heated with steam at a temperature of less than 100° C., preferably 80° C. to 95° C., in an atmosphere reduced to a pressure at which the boiling point of water is less than 100° C., preferably 80° C. to 95° C., and then the material is dried by a known drying method such as vacuum drying, shaking off, gas blowing, heating and others.

According to the third embodiment of the present invention, as described above, a material to be washed is dipped into an aqueous solution containing a surfactant having a water repellency so that at least one molecular layer of the water repellent surfactant is attached to the surface of the material to be washed, then the material to be washed is heated with steam at a temperature of less than 100° C., preferably 80° C. to 95° C., in an atmosphere reduced to a pressure at which the boiling point of water is less than 100° C., preferably 80° C. to 95° C., and the material then is blown with air and, thereafter, the material is dried by vacuum drying, shaking off, gas blowing, heating.

According to the fourth embodiment of the present invention, depending on the material to be washed and/or the causative substance of contamination, it is not necessary to dip the material into an aqueous solution of a surfactant having a water repellency. Thus, after washing in a conventional manner, not via the step of attaching the aligned molecular layer of the water repellent surfactant, the material to be washed may be placed in a vacuum kettle, then heated with steam at a temperature of less than 100° C., preferably 80° C. to 95° C., in an atmosphere reduced to a pressure at which the boiling point of water is less than 100° C., preferably 80° C. to 95° C. Subsequently, after blowing the material with gas such as air, the material is dried by vacuum drying. Thus, the desired washing/drying can be performed. This method can be applied to the case when washing with an aqueous solution other than an aqueous solution containing a surfactant having a water repellency therein.

Figure 2:
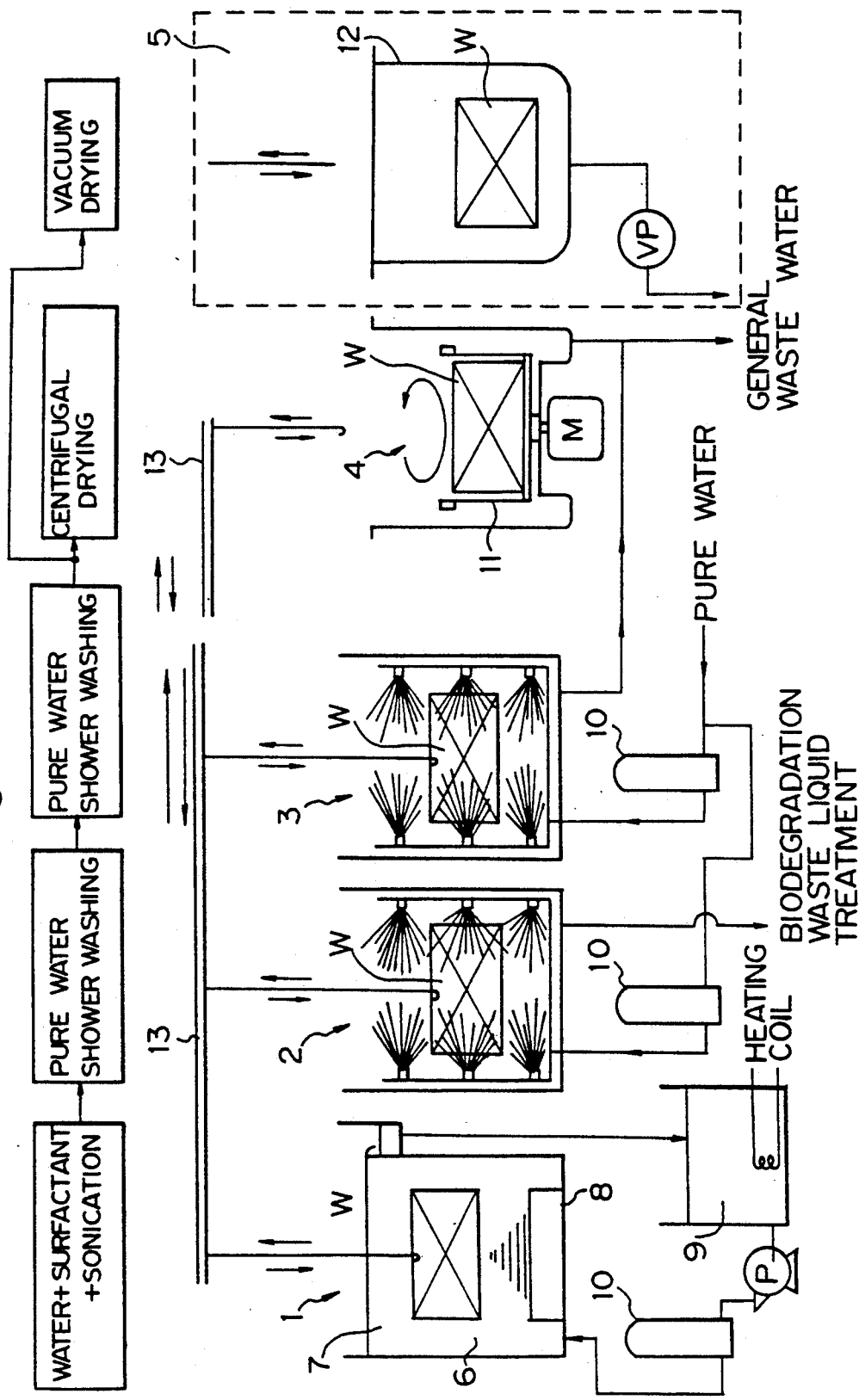
FIG. 2 is a drawing of the steps of, and a sectional view showing an example of the apparatus for, performing the washing and drying.

According to the fifth embodiment of the present invention, a washing/drying apparatus for carrying out washing/drying by use of an aqueous solution of a water repellent surfactant, as shown in FIG. 2, has a water tank 6 for containing an aqueous solution of a surfactant having a water repellency, a shower washing device for removing superfluous surfactant attached to the material W to be washed in the water tank 6, and a vacuum chamber 12 for drying the material to be washed after shower washing.

The vacuum chamber 12 has a means of jetting steam so that the material W to be washed can be heated with steam at a temperature less than 100° C., preferably 99° C. or lower and more preferably 80° C. to 95° C., in an atmosphere reduced to a pressure at which the boiling point of water is less than 100° C., preferably 99° C. or lower and more preferably 80° C. to 95° C., and further, has gas blowing means so that the water can be subsequently drained by blowing gas such as air. The means of jetting steam and the gas blowing (e.g., air blowing) means may commonly use a blowing means (nozzle).

As the above-mentioned water repellent surfactants, the surfactants such as hydrocarbon type surfactants having an alkyl chain length of the hydrophobic group of 12 to 18 in the hydrocarbon type, fluorine type surfactants having an alkyl chain length of the hydrophobic group of 6 to 12 in the fluorine type and a water-repellent silicone type surfactants may be employed.

There are no specific limitations to the conditions for dipping the material to be washed in an aqueous washing solution containing a water-repellent surfactant, and any conditions capable of forming at least one molecular layer of the water repellent surfactant on the surface of the material to be washed can be adopted, as long as at least one molecular layer of the water repellent surfactant is attached to the surface of the material. Although the preferable conditions may be varied depending upon the kinds of surfactants used, the preferable concentration of the surfactant in the aqueous, washing solution is 300 ppm or more, particularly 450 to 5000 ppm, the preferable temperature is 30° C. to less than 100° C., particularly 40° C. to 60° C., and the preferable dipping time is 10 sec or more, particularly 30 sec to 2 min.

According to another aspect of the present invention, there is provided a drying apparatus for drying, after thorough washing of materials (or articles) such as non-metallic (e.g., plastic) precision parts, electronic parts, non-metallic (e.g., plastic) cases for accommodating parts, by removing water or moisture adhered thereto by irradiating electromagnetic waves to the material to be dried thereby to heat the moisture adhered thereto, and, during or after heating the moisture, gas blowing, vacuum drying or centrifugal drying.

Figure 8:
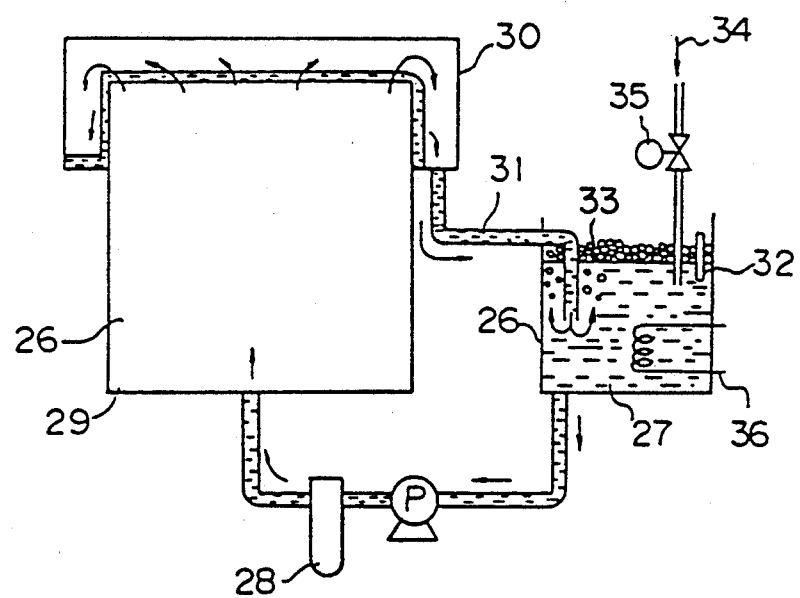
FIG. 8 is a drawing illustrating a conventional washing system using a washing solution containing a surfactant.

As mentioned above, according to the present invention, the water repellent surfactants and the other surfactants are added to an aqueous washing solution to enhance the detergency thereof, but this cases a problem of foaming during the above-mentioned circulating and filtering process, which comprises passing the washing solution through a fine filter and which is performed for maintaining a desired cleanliness factor of the washing solution. FIG. 8 shows the usual washing system, i.e., a system for circulating a washing solution obtained by adding a surfactant to water.

In this system, the washing solution 26 is pumped from a heat-exchange vessel 27 into a filter 28 and finely filtered, and then is transferred to a washing vessel 29. While the washing solution is being pumped, the solution in the washing vessel 29 overflows through the upper portion thereof into an overflow vessel 30 disposed at the brim of the vessel 29, and contaminants such as oil adhered to the materials to be washed are removed, because the contaminants float on the surface of the washing solution in the washing vessel 29, since they have a specific gravity lower than that of the washing solution. The overflow of the washing solution 26 is performed to prevent a readhering of the contaminants to the material which has been washed, when removed from the vessel. The washing solution 26 overflows into the overflow vessel 30 and is returned to the heat-exchange vessel 27 through a drainage piping 31, and thus the washing solution 26 is continuously recycled and filtered to maintain a desired cleanliness thereof. In general, the washing solution 26 is heated to enhance the washing ability, but in this case, a part of the water is evaporated, and correspondingly, the level of the washing solution is lowered and the concentration of the surfactant cannot be maintained at a desired constant level. Therefore, it is necessary to add water to the solution in an amount corresponding to that lost through evaporation. This is effectively performed by automatically supplying water through an automatic valve 35 by the action of a level sensor 32 affixed to the heat-exchange vessel 27, and wherein 36 denotes a heater.

Air is mixed in the washing solution 26 when the solution in the overflow vessel 30 enters the drainage piping 31, and as a result, foam 33 is generated on the surface of the solution retained in the heat-exchange vessel 27. The foam 33 is continuously generated, and in a short time, overflows from the heat-exchange vessel 27. In addition, the foregoing level sensor 32 is lifted by the action of the generated foam, and thus does not act as required.

According to a further aspect of the present invention, however, the above-mentioned generation of foam observed when a washing solution which is liable to cause foaming is subjected to the above-mentioned circulation, can be effectively suppressed or prevented.

In general, the amount of washing solution 26 discharged through the drainage piping 31 is greater than that pumped into the washing vessel by the action of the circulation pump D shown in FIG. 8, and accordingly, air is mixed in the washing solution 26, and therefore, foam is generated. Conversely, if the amount of washing solution 26 discharged through the drainage piping 31 is smaller than that pumped into the washing vessel by the action of the circulation pump, the water level in the overflow vessel 30 rises, and within a short time, the washing solution 26 overflows from the overflow vessel 30.

According to the foam-suppressing apparatus of the present invention, the foaming can be effectively prevented because the overflow vessel 30 is filled with the washing solution 26, to a level at which the air is not mixed in the solution 26, and the flow rate of the washing solution 26 discharged through the drainage piping 31 is automatically controlled so that the amount thereof is equal to that pumped into the washing vessel 29 by the circulating pump.

In the first embodiment according to the first aspect of the present invention, by dipping a material to be washed into an aqueous solution containing a surfactant having a water repellency (which repels water) before drying by a known drying method such as vacuum drying, shaking off, gas blowing (e.g., air blowing), and heating, at least one molecular layer of a water repellent surfactant is attached to the surface of the material to be washed. This also functions to wash the material to be washed, and if the product has been already washed in another step, the object is to attach at least one molecular layer of the water repellent surfactant to the surface of the material to be washed, as a pre-treatment to the washing step.

The aqueous solution containing a surfactant having a water repellency is not an excellent washing solution in itself, but will exhibit a strong washing ability when used, for example, in combination with a sonication washing. Depending on the material to be washed and/or the causative substance of contamination, a sufficient washing can be carried out by using an aqueous solution of a surfactant having a water repellency as the washing solution.

Thus, when an aqueous solution containing a surfactant having a water repellency as the washing solution, after washing with an aqueous solution containing a surfactant having water repellency, when drawing up the material to be washed from the water tank, the surfactant will be attached in a state in which at least one molecular layer is aligned thereon. As a result, the surface of the material to be washed has a good water repellency, whereby the water becomes beaded, and by thereafter carrying out drying by a known drying method such as vacuum drying, shaking off, gas blowing (e.g., air blowing), and heating, it can be easily and rapidly dried.

Namely, when the material is washed with an aqueous solution containing a surfactant having a water repellency, since the washing solution itself has a water repellency, it has a good dryability, and drying can be easily and rapidly effected by subsequently drying in a conventional manner such as shaking off, gas blowing (e.g., air blowing), and heating.

In contrast, when the material is washed with an aqueous solution other than the aqueous solution containing surfactant having a water repellency, the subsequent drying becomes difficult. Nevertheless, even after washing with such an aqueous solution having no water repellency, preferably the material to be washed is dipped in an aqueous solution containing a surfactant having a water repellency as a pre-treatment, before drying and after washing. After dipping, when draining the material to be washed, at least one molecular layer is attached to the surface of the material to be washed, as described above, whereby a water repellency is created on the surface of the material to be washed, and thereafter, drying can be rapidly carried out by a conventional drying method such as vacuum drying, shaking off, gas blowing (e.g., air blowing), and heating.

In the second embodiment according to the first aspect of the present invention, as described above, when dipped into an aqueous solution containing a surfactant having a water repellency, said surfactant is attached as at least one molecular layer to the surface of the material to be washed, whereby the water on the surface of the material to be washed becomes beaded and can be easily removed when dried. For a material which is particularly difficult to dry, such as a part having a complicated shape, even if the surface has a water repellency, the drying is insufficient when using only known drying methods such as vacuum drying, shaking off, gas blowing (e.g., air blowing), and heating.

By heating, after blowing steam against the material to be washed, the viscosity of the water will be lowered and it will be readily evaporated, whereby the drying becomes easier. Since, however, water has a high boiling point of 100° C., just blowing steam against the material, depending on the material to be washed, overheats the material, and thus the material to be washed may be damaged. Further, the attached molecular layer of the surfactant will be removed.

Accordingly, the present invention employs a method in which the heating is effected with steam but in an atmosphere reduced to a pressure such that the temperature does not reach 100° C. In a reduced pressure atmosphere, the boiling point of water will be lowered and becomes lower than 100° C., which is the boiling point under atmospheric pressure. Therefore, depending on the properties of the material to be washed, and so that the boiling temperature is such that the attached molecular layer of the surfactant is not removed, the pressure of the atmosphere in the steam heating treating portion is reduced.

Thus, by effecting steam heating at a relatively lower temperature, so that the material to be washed is not damaged and the attached molecular layer of the surfactant is not removed, the viscosity of the water on the surface of the material to be washed is lowered and a latent evaporation heat is given thereto, whereby the subsequent drying can be effected by only a conventional drying means such as vacuum drying, shaking off, gas blowing (e.g., air blowing), heating.

In the third embodiment according to the first aspect of the present invention, as described above, by steam heating the material to be washed at a relatively lower temperature to an extent such that it is not damaged and the aligned molecular layer of the surfactant is not removed, it can be dried by a conventional drying means such as vacuum drying, shaking off, and gas blowing (e.g., air blowing), heating with relative ease but will take a long time to dry, and a very complicated material becomes difficult to dry.

If after the steam heating at a low temperature as described above, blowing with air is carried out, the water shaped in beads on the surface of the material to be washed is blown off. If hot air is used at this time, then the material to be washed (which has been previously heated by steam) cannot be cooled, and therefore, the latent heat necessary for evaporation of the water is supplied, and drying will also proceed by evaporation.

Even after blowing with air, water remains at sites where the blown air cannot reach, such as a sink, etc., but since a vacuum drying is subsequently effected according to the present invention, water in the sinks, etc., will be removed by suction, whereby a rapid drying can be achieved with a material to be washed that has a complicated shape and is difficult to dry.

In the fourth embodiment according to the first aspect of the present invention, as described above, after the aqueous solution containing a surfactant having a water repellency has been added and drawn up, most preferably a steam heating under a reduced pressure, a blowing with, for example, air, or a vacuum drying is carried out. Nevertheless, depending on the kind of material to be washed, without a dipping thereof into the aqueous solution containing a surfactant having a water repellency, a sufficient drying is possible only by using a combination of heating with a low temperature steam of less than 100° C., preferably 99° C. or lower, more preferably 80° C. to 95° C., and blowing with, for example, air, and then vacuum drying.

More specifically, after washing with an aqueous solution other than the aqueous solution containing a surfactant having a water repellency, when the material to be washed is placed in a vacuum kettle to be brought to a reduced pressure, and heated with low temperature steam at 99° C. or lower, the viscosity of water is lowered and becomes more readily vaporizable by heat. Accordingly, when blowing with air is subsequently conducted, the water is easily blown off. Then, due to the subsequent vacuum drying, water in the sinks, etc., is easily removed by suction.

A series of these treatments can be carried out in a single vacuum chamber, and are easily workable. Namely, the vacuum kettle containing the material to be washed may have a reduced pressure and be heated with steam, then the feeding of steam is discontinued and the nozzle is switched to an air source, whereby air is blown therein. Subsequently, the air blowing is stopped, and a vacuum drying is performed to complete the series of drying treatments.

In the fifth embodiment according to the first aspect of the present invention, as the surfactant having a water repellency there are known the hydrocarbon type, the silicon type and the fluorine type, but the hydrocarbon type and the fluorine type are most suited for this washing and drying. In the case of the hydrocarbon type, surfactants with a hydrophobic group having an alkyl chain length of 12 to 18, and in the fluorine type those with an alkyl chain length of 6 to 12, are preferable.

The washing/drying apparatus of the present invention, i.e., the apparatus which performs the washing and drying by using an aqueous solution of a water repellent surfactant, is provided with washing devices next to the washing vessel holding an aqueous solution of a surfactant having a water repellency, and therefore, superfluous surfactant on the material to be washed is removed by a shower washing, and thus a necessary minimum amount of the water repellent surfactant is always attached to the surface of the material to be washed, whereby the water repellent effect can be stably maintained.

The apparatus also is provided with a vacuum chamber for drying the material to be washed after the shower washing. The vacuum chamber has a means for jetting steam such that the material to be washed can be heated by steam at a temperature of less than 100° C., preferably 99° C. or less and more preferably 80° C. to 95° C., in an atmosphere having a reduced pressure, so that the boiling point is less than 100° C., preferably 99° C. or less, more preferably 80° C. to 95° C., and further, has a blowing means whereby water can be removed by blowing gas (e.g., air).

To accomplish this, the three treatments, i.e., low temperature steam heating, gas blowing and vacuum drying, are conducted continuously by a single vacuum chamber, to give a better workability and simplify the apparatus.

According to the first embodiment of the second aspect of the present invention, the moisture adhered to the surface of the non-metallic precision parts, electronic parts and cases for accommodating the parts is heated by irradiating these materials with electromagnetic waves of 2450 MHz, without heating the subject per se. The higher the irradiation power of electromagnetic waves and the longer the irradiation time, the higher the heating rate of the moisture adhered to the surface of these materials. The temperature of the heated moisture is at highest 100° C. In addition, the coefficient of thermal conductivity of the materials to be washed, such as those of plastics per se, is very small. Therefore, if the material is irradiated with the electromagnetic waves while blowing, for example, air, thereon, the water drops always move over the surface of the material to be washed and the temperature of the material per se does not rise. Thus, the irradiation with the electromagnetic waves does not exert any detrimental influence on the material, such as thermal deformation. When a material which is liable to suffer thermal deformation is treated, the foregoing detrimental effects such as thermal deformation can be effectively eliminated by lowering the irradiation power of the electromagnetic waves, by intermittently irradiating the material with the electromagnetic waves, or by controlling the irradiation power or the length of the irradiation time while detecting the temperature of the material to be washed, using an infrared radiation thermometer.

As explained above, if the material to be washed is subjected to air blowing while heating the moisture adhered to the material through the irradiation with the electromagnetic waves, the material can be effectively dried without an adverse affect, such as heat deformation, on the material.

In addition, it is also possible to perform the gas-blowing, such as the air-blowing, after the material is heated through the irradiation with the electromagnetic waves, without an adverse affect on the material, depending on the kind of the material to be washed. For example, this is true in cases wherein the heat resistance of the material to be washed is very high or the material has a shape which can prevent the residence of water, therein or thereon and thus is not damaged by the residence thereon of water at a high temperature.

According to the second embodiment of the second aspect of the present invention, the moisture adhered to the surface of the non-metallic precision parts, electronic parts and cases for accommodating the parts is heated by irradiating these materials with electromagnetic wave of 2450 MHz without heating the materials per se. The higher the irradiation power of electromagnetic waves and the longer the irradiation time, the higher the heating rate of the moisture adhered to the surface of these materials. The temperature of the heated moisture is at highest 100° C. under the atmospheric pressure, but if the material is heated through the irradiation with the electromagnetic waves under a reduced pressure in the vacuum chamber, the boiling point of water can be arbitrarily reduced by controlling the degree of vacuum. Thus, if the material is heated through the irradiation with the electromagnetic waves at a reduced pressure of not more than the predetermined level corresponding to the degree of vacuum which ensures that the temperature of the material is not higher than the heat-resisting temperature thereof throughout the irradiation with the electromagnetic waves, the temperature of the material per se does not rise, and thus the irradiation with the electromagnetic waves does not have an adverse affect on the materials, such as thermal deformation.

As explained above, if the material to be washed is heated to remove the moisture adhered to the material through the irradiation with the electromagnetic waves under a reduced pressure in the vacuum chamber, the material can be effectively dried without an adverse affect, such as heat deformation, on the material.

In addition, it is also possible to perform the treatment under a reduced pressure after the material is heated through the irradiation with the electromagnetic waves, without an adverse affect on the material, depending on the kind of the material to be washed. For example, this is true in cases wherein the heat resistance of the material to be washed is very high or the material has a shape which can prevent the residence thereon of water, and thus is not damaged by the residence thereon of water at a high temperature.

According to the third embodiment of the second aspect of the present invention, the moisture adhered to the surface of the non-metallic precision parts, electronic parts and cases for accommodating the parts is heated by irradiating these materials with electromagnetic wave of 2450 MHz, without heating the materials per se. The higher the irradiation power of electromagnetic waves and the longer the irradiation time, the higher the heating rate of the moisture adhered to the surface of these materials. The temperature of the heated moisture is at highest 100° C. In addition, the coefficient of thermal conductivity of the materials to be washed, such as those of plastics per se, is very small. Therefore, if the material is irradiated with the electromagnetic wave while the material is subjected to centrifugation, the water drops always move over the surface of the material to be washed and the temperature of the material per se does not rise, and thus the irradiation with the electromagnetic waves does not have an adverse affect on the materials, such as thermal deformation. When a material which is liable to suffer thermal deformation is treated, the foregoing detrimental effects such as thermal deformation can be effectively eliminated by lowering the irradiation power of the electromagnetic waves, by intermittently irradiating the material with the electromagnetic waves, or by controlling the irradiation power or the length of the irradiation time while detecting the temperature of the material to be washed, using an infrared radiation thermometer.

As explained above, if the material to be washed is heated to remove the moisture adhered to the material through the irradiation with the electromagnetic waves while the material is subjected to centrifugation, the material can be effectively dried without an adverse affect, such as heat deformation, on the material.

In addition, it is also possible to perform the treatment by centrifugation after the material is heated through the irradiation with the electromagnetic waves, without an adverse affect on the material, depending on the kind of the material to be washed. For example, this is true in cases wherein the heat resistance of the material to be washed is very high or the material has a shape which can prevent the residence of water, and thus is not damaged by the residence thereon of water at a high temperature.

EXAMPLES

Figure 3:
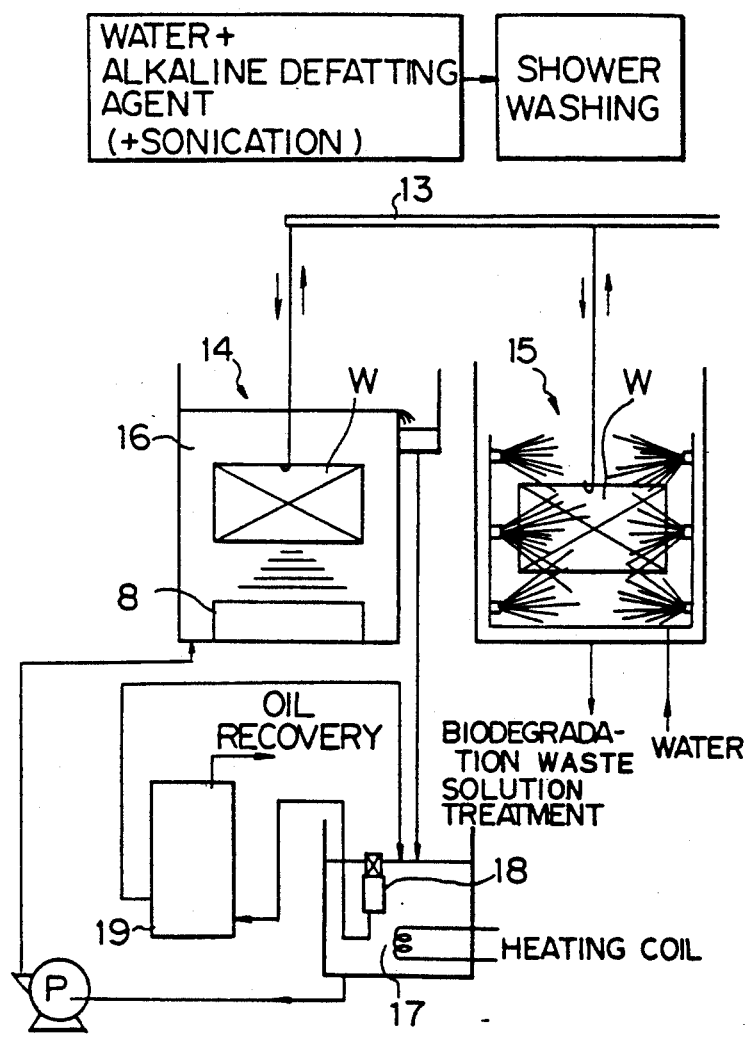
FIG. 3 is a drawing of the steps of, and a sectional view showing an example of the apparatus which performs, a washing treatment according to the present invention, without using the aqueous solution of a water repellent surfactant.

Practical embodiments of the washing/drying method, and the washing/drying apparatus will be described with reference to, but are by no means limited to, the Examples. FIGS. 2 and 3 are examples of the apparatus for performing the washing/drying method of the present invention. FIG. 2 shows the steps of the process and a longitudinal sectional view of the apparatus. The apparatus is provided with a washing device or vessel 1 containing an aqueous solution containing a surfactant having a water repellency, a first shower device 2, a second shower washing device 3, a centrifugation drying device 4, and a vacuum drying device, arranged in this order.

In FIG. 2, the washing device 1 contains an aqueous solution 7, containing a surfactant having a water repellency, received in a water vessel 6, and having a sonication generation device 8 provided therein. The washing device 1 is adapted to recover the flow of contaminants generated by washing, to heat same in the heating water vessel 9, and to clean same with the filter 10 for reuse.

The first shower washing device 2 and the second shower washing device 3 jet pure water against the material W to be washed, to wash off the previous washing liquid.

The centrifugal drying device 4 removes water by centrifugal force, by rotating the basket 11, in which the material W to be washed is placed, by the motor M.

The vacuum drying device 5 removes water by suction, by reducing the pressure by a vacuum pump VP when the material W to be washed is hermetically sealed in the vacuum chamber 12.

Numeral 13 represents a conveying machine, and to perform the washing and drying when the material W to be washed is placed in the aqueous layer 6 containing the aqueous solution 7 of a surfactant having a water repellency is added, the sonication generating device 8 is driven to remove contamination and dust on the surface of the material W to be washed. After completion of the washing, the material W to be washed is suspended from the conveying machine 13 and conveyed thereby to the first shower washing device 2, and the surfactant having a water repellency will be attached thereto, while aligned in at least one molecular layer on the surface of the material W to be washed, after the washing.

In practice, rarely is only one molecular layer attached, and usually a plural number of molecular layers are present. Therefore, in the first shower washing device 2, the aqueous solution of the surfactant having a water repellency is washed off with pure water. If the superfluous water repellent surfactant can be removed only with the pure water jetting by the first shower washing device 2, this pure water shower washing alone will suffice as the first step, but if not, then the material W is conveyed to the second shower washing device 3 to be again washed with pure water. Accordingly, at least one molecular layer of the surfactant having a water repellency is attached to the surface of the material W to be washed.

After having thus removed superfluous water repellent surfactant, drying is carried out in a conventional manner. That is, in the centrifugation drying device 4, the material W to be washed is placed in a basket 11, which is rotated by a motor M, and the water is removed by centrifugal force. Alternatively, when the material W is hermetically sealed in the vacuum chamber 12, the pressure is reduced by a vacuum pump VP to aspirate the water by suction.

Although superfluous surfactant can be removed by only shower washing, as described above, at least one molecular layer remains on the surface of the material W, whereby the requisite water repellency can be maintained to repel water, and the water attached thereto is beaded. As a result, the water will fall off under its own weight, and therefore, compared with the case of using a surfactant having no water repellency, or when not using a surfactant, the amount of water attached will be reduced to about ⅓, and thus the load at the next drying treatment step will be alleviated.

Further, the surface of the film on which the water repellent surfactant is attached repels water, as mentioned above, to form water beads, and these beads can be easily removed even by a conventional drying method such as centrifugal force or a vacuum aspiration.

For drying after the pure water shower washing, in addition to the centrifugal separation or vacuum drying processes, there also may be employed methods such as blowing, for example, air, onto the material W or heating same.

The vacuum chamber 12 of the vacuum drying apparatus 5 has a means for jetting steam, whereby the material W to be washed can be heated with steam at a temperature of less than 100° C. in an atmosphere having a reduced pressure at which the boiling point of the water is less than 100° C., and further, has a blowing means whereby the water can be removed by blowing gas such as air thereon.

Therefore, by jetting steam under a reduced pressure, the material to be washed can be heated with steam at a temperature of less than 100° C., preferably 80° C. to 95° C., as mentioned above. This steam heating lowers the surface tension of the water, and further, heats the material W to be washed to thereby make the water readily vaporizable. In the same vacuum chamber 12, the water is then blown off by blowing a normal temperature gas (e.g., air) or hot gas (e.g., air) thereon, and then the water discharged by suction under a vacuum.

After steam heating is effected when the boiling point is thus lowered, a vacuum chamber 12 capable of gas (e.g., air) blowing is provided, and as mentioned above, this is also effective for drying after a water washing not using an aqueous solution of a water repellent surfactant.

The temperature of the low temperature steam depends on the pressure, and therefore, the limit is about 40° C. at about −700 mHg, which is the capacity of a conventional vacuum pump; further lowering of the temperature can be made by improving the capacity of the vacuum pump.

The apparatus in FIG. 2 is intended to enhance the drying effect by performing washing with an aqueous solution of a water repellent surfactant, and utilizing the water repellent effect of the water repellent surfactant attached to the surface of the material W to be washed after washing, but in the case of a material (or article) to which oil is adhered, such as a material W to be washed after mechanical working, a proper wash can be obtained only by using the water repellent surfactant and the sonication generation apparatus in combination.

Thus, in the case of a material W to be washed to which an oily component is adhered, after previously washing the material with an oily component in a special washing vessel 14 as shown in FIG. 3, the material W is washed in a shower washing device 15. Then, using a conveying machine 13, the material W is transferred to a washing device 1 containing the aqueous solution of the water repellent surfactant shown in FIG. 2, and the water repellent surfactant is attached thereto. In this case, the sonication generation device 8 in the water vessel 6 should not be driven, but when the material W to be washed after oil component is removed is to be rewashed with the aqueous solution of the water repellent surfactant, the sonication generation device 8 is driven to perform the washing. The subsequent procedures are as described in FIG. 2.

In FIG. 3, the oily component washing vessel 14 has an aqueous solution 16 containing an alkaline defatting agent (e.g., Fine Cleaner FC35 available from Nippon Perkarizing Co.) suitable for oil washing in the water vessel, and has the sonication generation device 8 therein. The oily component floating on the surface is recovered by the recovery device 17, and then the liquid surface portion alone is recovered by the oil collecting float 18, and thereafter, the oily component is separated and removed in the oil separating device 19.

Next, the surfactant having a water repellency, and the washing and drying conditions, are described. In the present invention, washing with an aqueous solution containing a surfactant having a water repellency, or a drying pre-treatment after washing is practiced. Therefore, a surfactant having a strong washing effect and a water repellency is required. More specifically, it is important to use a surfactant to lower the surface tension and increase the wettability and penetrability. Generally, as the surfactant, there are known the hydrocarbon type, silicon type and fluorine type, but as a result of a study by the present inventors, the fluorine type surfactants having the following characteristics are most preferable for attaining the objects of the present invention:

(1) A very high ability to lower the surface tension. For example, for the fluorine type: 15 dyn/cm, the silicone type: 22 dyn/cm, and the hydrocarbon type: 30 dyn/cm.
(2) A good water repellency and oil repellency.
(3) An excellent heat-resistant stability.
(4) Little (i.e., low) toxicity.

Thus, when a surfactant having a water repellency and having a low surface tension is used, the washability is enhanced and the amount of water attached becomes smaller, (i.e., is reduced) whereby enhancement of the dryability can be expected. Also, due to the oil repellency, the oil liberated from the material to be washed can be more easily recovered by the oil separation device, and reattachment of the oil component to the material to be washed can be prevented.

For the fluorine type surfactants, the optimum treatment conditions for lowering the amount of water attached were investigated. In the Experiments, the anionic type, i.e., perfluoroalkyl carboxylate (S-113) and perfluoroalkyl phosphate (S-112), the nonionic type, i.e., perfluoroalkylamine oxide (S-141) and the cationic type, i.e., perfluoroalkyl trimethylammonium salt (S-121), were tested by varying the temperature and the treatment time. The sample materials to be washed were an aluminum plate (i.e., aluminum A 5052) having a size of 50 mm × 50 mm × 1 mm.

Experiments were conducted by varying the temperature by 10° C. in a range of 30° C. to 70° C., and the dipping time was made 15, 30, 45, 60, 90, and 120 seconds. The results are shown in Table 1.

TABLE 1

| Temp. (C.°) | Sur- factant | Dipping time (sec) (Degree of water wetting) | | | | | |
|---|---|---|---|---|---|---|---|
| | | 15 | 30 | 45 | 60 | 90 | 120 |
| 30 | S-113 | 95% | 90% | 85% | 85% | 80% | 80% |
| | S-112 | 100% | 100% | 100% | 100% | 100% | 95% |
| | S-141 | 100% | 100% | 100% | 100% | 95% | 90% |
| | S-121 | 100% | 100% | 100% | 100% | 90% | 90% |
| 40 | S-113 | 95% | 85% | 80% | 70% | 50% | 5% |
| | S-112 | 100% | 100% | 100% | 95% | 95% | 90% |
| | S-141 | 100% | 100% | 100% | 90% | 90% | 85% |
| | S-121 | 100% | 100% | 100% | 100% | 90% | 90% |
| 50 | S-113 | 90% | 80% | 50% | 5% | 0% | 0% |
| | S-112 | 100% | 100% | 100% | 95% | 90% | 80% |
| | S-141 | 100% | 100% | 95% | 95% | 90% | 80% |
| | S-121 | 100% | 100% | 100% | 100% | 90% | 80% |
| 60 | S-113 | 80% | 70% | 5% | 0% | 0% | 0% |
| | S-112 | 100% | 100% | 95% | 90% | 80% | 60% |
| | S-141 | 100% | 100% | 90% | 90% | 80% | 70% |
| | S-121 | 100% | 100% | 100% | 100% | 90% | 80% |
| 70 | S-113 | 70% | 5% | 0% | 0% | 0% | 0% |

TABLE 1-continued

| Temp. (°C.) | Sur-factant | Dipping time (sec) (Degree of water wetting) | | | | | |
|---|---|---|---|---|---|---|---|
| | | 15 | 30 | 45 | 60 | 90 | 120 |
| | S-112 | 80% | 75% | 65% | 50% | 20% | 0% |
| | S-141 | 80% | 80% | 60% | 50% | 30% | 10% |
| | S-121 | 100% | 100% | 100% | 100% | 80% | 70% |

As a result, it was found overall that a higher temperature and a longer dipping time reduces the amount of water attached. Among the anionic, nonionic and cationic types, the amount of water attached was the smallest with the anionic type, followed by the nonionic type. Among the anionic type, a perfluoroalkyl carboxylate leaves a particularly small amount of water attached, and a perfluoroalkyl phosphate is substantially the same as a perfluoroalkylamine oxide.

As a result, a perfluoroalkyl carboxylate of the anionic type was found to provide the highest water repellency. In the case of a perfluoroalkyl carboxylate of the anionic type, the amount of water attached was zero when dipped at 50° C. for 90 seconds or longer, at 60° C. for 60 seconds or longer, and at 70° C. for 45 seconds or longer.

Figure 4:
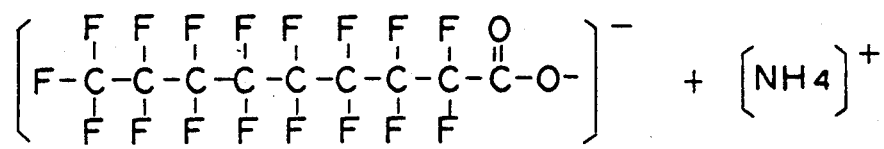
FIG. 4 is a drawing showing the chain structure of a perfluoroalkyl carboxylate, which is one example of the water repellent surfactant according to the present invention, and a model in which the surfactant is adhered, as a one molecular layer, on the surface of the material to be washed.
Figure 4:
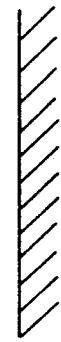

A perfluoroalkyl carboxylate has a chain structure as shown in FIG. 4, and although the alkylcarbon chain length in this FIG. is 8, an alkylcarbon length of about 6 to 12 in the water repellent surfactant of the fluorine type provided an excellent water repellency. In this connection, the hydrocarbon type with alkylcarbon chain lengths of about 12 to 18 also had an excellent water repellency.

Next, for the surfactant water repellency, the concentrations when using perfluoroalkyl carboxylates were determined, at 40° C., 50° C., and 60° C., when the perfluoroalkyl carboxylate concentration was varied to 30 ppm, 150 ppm, 300 ppm, 1500 ppm, and 3000 ppm, and the dipping time fixed at 1 minute. The results are shown in Table 2.

TABLE 2

| Temp. (°C.) | Conc. of Perfluoroalkylcarboxylate | | | | |
|---|---|---|---|---|---|
| | 30 ppm | 150 ppm | 300 ppm | 1500 ppm | 3000 ppm |
| 40 | 100% | 100% | 50% | 30% | 30% |
| 50 | 100% | 100% | 20% | 0% | 0% |
| 60 | 100% | 90% | 0% | 0% | 0% |

As shown in Table 2, even when the concentration was 3000 ppm at 40° C., the amount attached was about 30%. At 50° C., when the concentration became 1500 ppm or higher, the amount of water attached was zero, and at 60° C., at a concentration of 300 ppm or more, the amount of water was zero. Therefore, at a dipping time of 1 minute and a liquid temperature of 60° C., the amount of water attached can be made zero if the concentration is made 300 ppm or higher.

Next, detailed examinations at about around 300 ppm while varying the dipping time to 30 seconds, 1 minute, and 1 minute and 30 seconds were carried out. The results are shown in Table 3.

TABLE 3

| Temp. (°C.) | Dipping time | Conc. of Perfluoroalkylcarboxylate | | | | |
|---|---|---|---|---|---|---|
| | | 240 ppm | 300 ppm | 450 ppm | 600 ppm | 900 ppm |
| 40 | 30 sec | 100% | 100% | 95% | 95% | 95% |
| | 1 min 00 sec | 100% | 50% | 40% | 40% | 40% |
| | 1 min 30 sec | 100% | 40% | 30% | 20% | 10% |
| 50 | 30 sec | 100% | 90% | 90% | 85% | 50% |
| | 1 min 00 sec | 90% | 20% | 20% | 5% | 5% |
| | 1 min 30 sec | 80% | 10% | 0% | 0% | 0% |
| 60 | 30 sec | 100% | 80% | 60% | 20% | 20% |
| | 1 min 00 sec | 80% | 10% | 0% | 0% | 0% |
| | 1 min 30 sec | 70% | 0% | 0% | 0% | 0% |

As is clear from the results shown in Table 3, by dipping at 50° C. for 1 minute and 30 seconds and making the concentration 450 ppm or more, the amount of water attached was zero. At 60° C., at concentrations of 450 ppm or more, by dipping for one minute, the amount of water attached was zero, and by dipping for 1 minute and 30 seconds, at concentrations of 300 ppm, the amount of water attached was zero. Therefore, by dipping at 60° C. for one minute, to obtain a high water repellency, the concentration must be made 450 ppm or higher.

Further, since the surface tension of pure water with a perfluoroalkyl carboxylate can be lowered to about 17 dyn/cm by an addition of 300 ppm thereof, from the standpoint of the surface tension, a concentration of 300 ppm or more is desirable, but in view of the treatment margin, about 600 ppm is most preferable. The surface tension is 73 dyn for pure water and 20 dyn for Freon 113.

Next, in an aqueous solution with a perfluoroalkyl carboxylate concentration of 600 ppm, which is the optimum concentration, by determining the amount of water attached after sonication washing (i.e., frequency 28 kHz, power 200 W) at a liquid temperature of 60° C. for 1 minute, the water repellent effect was evaluated. As a result, a material subjected to sonication washing in an aqueous solution with ammonium perfluoroalkyl carboxylate (concentration: 600 ppm) had about ⅓ the amount of water attached compared with material washed only with pure water. Further, when subjected to air blowing (air at 6 kg/cm²G was blown for 3 sec. at a distance of 50 cm), compared with a material subjected to air blowing after washing only with pure water, the amount of water attached became 1/1000 or lower. Thus, by removing water by air blowing after washing with an aqueous solution of a water repellent surfactant, the drying effects are enhanced.

Nevertheless, even if the amount of water attached is greatly reduced, a complete drying cannot be effected, and therefore, a heating of the material to be washed was investigated as a method of realizing a complete drying. This is because heating the material to be washed results in a lowering of the viscosity of water, and promotes an easier vaporizability by heat. Particularly, in contrast to the vaporization heat of Freon 113, which is 35 cal/g, that of water is greater by 15-fold at 539 cal/g, having a greater heat content necessary for water vaporization, and therefore, it is important to previously provide a large amount of heat to the material to be washed.

Accordingly, as a result of an investigation of heat sources, compared with hot water or hot air, steam heating was found to be most effective. Steam has a large amount of heat storage, and can be heated at a high speed, and therefore, a sufficient heat content for vaporizing water can be provided.

Nevertheless, since the boiling point of water is as high as 100° C., depending on the kind of the material to be washed, there is a fear that the material to be washed may be damaged, and that the aligned molecular layer of the surfactant intentionally attached thereto will be removed.

Accordingly, in the present invention, although heating is done with steam, a method of blowing steam in a reduced atmosphere wherein the temperature will not become as high as 100° C. was attempted. As a result, when steam was jetted by reducing the pressure so that the boiling point of water was less than 100° C., preferably 99° C. or lower, more preferably 80°–95° C., it was found that water is effectively removed but the aligned molecular layer of the surfactant is not removed. Therefore, depending on the properties of the material to be washed, preferably the temperature of the jetting steam is within this range.

It has been found that a low temperature steam heating is indispensable, but the following various experiments and improvements as shown below were repeated, to further enhance the drying effect:

(1) Vacuum drying alone conducted after low temperature steam heating.
(2) After low temperature steam drying, vacuum drying is effected followed by hot air feeding in a vacuum kettle.
(3) After low temperature steam drying, the lid of the vacuum kettle is opened and hot air is blown therein followed by vacuum drying.
(4) After low temperature steam heating, hot air feeding (dry replacement) is effected in a vacuum kettle, followed by vacuum drying.

Among the above, the best results were obtained by the method (3) in which hot air was blown under an atmospheric pressure after a low temperature steam heating, followed by vacuum drying. In the method (1), water remained even after vacuum drying for 30 minutes.

As described above, air blowing was effective, and therefore, air blowing with hot air was attempted aiming at the effect of air blowing without damaging the material or by low temperature steam heating, and extremely good results were obtained. By performing hot air blowing for 10 seconds, almost all of the water was blown off and evaporated by heating. When vacuum drying was effected after hot air blowing for 20 minutes, the material was completely dried.

In the case washing a material with a simple shape, vacuum drying is not always required, but in the case of a material with a complicated shape, such as one having sinks, etc., a complete drying is rendered possible only by finally effecting a vacuum aspiration. The vacuum drying is generally effected at an ambient temperature, but if desired, the vacuum evacuation can be carried out while heating at a temperature of less than 100° C.

As described above, the best drying method has been determined, and depending on the kind and properties of the material to be washed and the substance causing the contamination, it is clear the material can be washed even with an aqueous solution of a water repellent surfactant for a drying pre-treatment, without the need for a special washing as shown in FIG. 3.

For example, an aluminum sample treated with Arosin was coated with three kinds of cutting oils, (i.e., GM5, GS5, and FW68, all available from Nippon Oil Co., Ltd) and was subjected to sonication washing (i.e., 28 kHz×200 W) in the above-mentioned aqueous perfluoroalkyl carboxylate solution at 60° C. for 1 minute, then shower washed with pure water and dried. As a result, for all three oils, no oil staining was found, and thus a good defatting treatment was effected.

Regarding the effect when washing away dust, washing with an aqueous solution of water repellent surfactant according to the present invention was found to give a better effect than washing with a conventional fluorocarbon as in the prior art, with a residual use amount of about 1/10 or less.

Next, the effect on the material to be washed, when washed and dried according to the method of the present invention, was investigated. The materials to be washed were two kinds of Kanizen plated products, two kinds of Arosin plated products, and one kind of battery oxidized treated product, and the corrosion resistance thereof was tested. As a result, no abnormality was found in any of the five products. Also, after Cellophane tape was adhered thereto, an adhesion test was conducted by peeling the tape from the material, but no abnormality was found in any of the five products.

Figure 5:
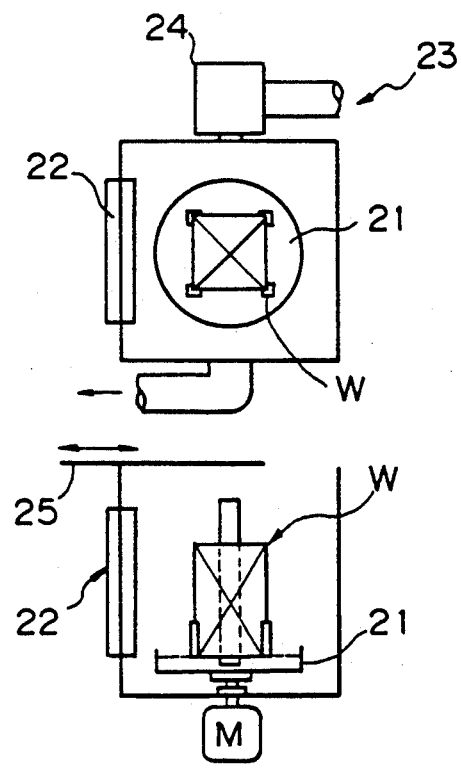
FIGS. 5 to 7 are sectional views of other examples of the drying apparatus according to the present invention.

According to an aspect of the present invention, there is provided an apparatus for water-draining and drying non-metallic precision parts, electronic parts and cases for accommodating parts which have been thoroughly washed with water by blowing air or the like thereon, during or after irradiating these materials with electromagnetic waves to heat the moisture adhered thereto. As shown in FIG. 5, the apparatus comprises a rotatable table 21 which makes it possible to efficiently heat the material W to be washed and an electromagnetic wave-irradiation device 22 capable of irradiating the material with electromagnetic waves of 2450 MHz, thereby heating the moisture adhered to the material, and an air-blower device 23 for blowing, for example, air onto the material to remove the heated moisture on the material, to thus water-drain or dry the same. The table 21 need not be rotatable, as this depends on the shape of the material W. Note, 25 denotes a lid. This rotating system can be also applied to the shower washing apparatus, whereby the water blow nozzles can be placed so that the water shower comes from only one or two directions.

Figure 6:
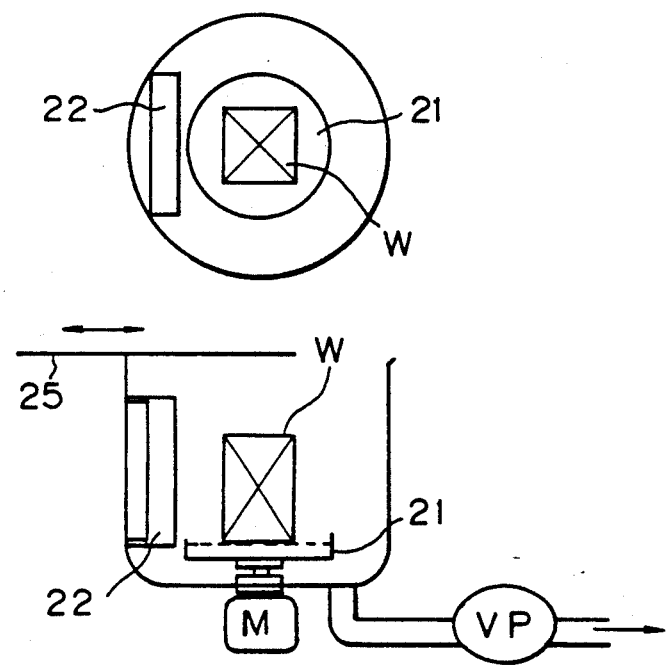

An apparatus shown in FIG. 6 is another drying apparatus for evaporating the moisture adhered to non-metallic precision parts, electronic parts and cases for accommodating the parts which have been thoroughly washed with water, to dry the materials by applying a reduced pressure to these non-metallic materials W to be washed, during or after irradiating these materials with electromagnetic waves to heat the moisture adhered thereto. As shown in FIG. 6, the apparatus comprises a rotatable table 21 which makes it possible to efficiently heat the material W to be washed, and an electromagnetic wave-irradiation device 22 capable of irradiating the material with electromagnetic waves of 2450 MHz, thereby heating the moisture adhered to the material, and a vacuum pump VP for establishing a reduced pressure or a vacuum to evaporate off and remove the heated moisture adhered to the material, to thus dry the same. The table 21 need not be rotatable, as this depends on the shape of the material W.

Figure 7:
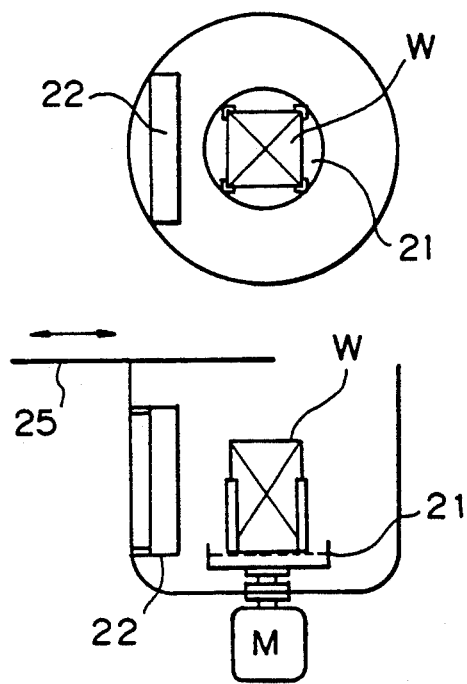

An apparatus shown in FIG. 7 is a further drying apparatus for spin-drying non-metallic precision parts, electronic parts and cases for accommodating the parts, which have been thoroughly washed with water, by subjecting these non-metallic materials to be washed to centrifugation, during or after irradiating these materials with electromagnetic waves to heat the moisture adhered to the materials. As shown in FIG. 7, the apparatus comprises a rotatable table 21 which makes it possible to efficiently heat the material W to be washed and an electromagnetic wave-irradiation device 22 capable of irradiating the material with electromagnetic waves of 2450 MHz, thereby heating the moisture adhered to the material. The table 21 is also capable of being rotated at a high speed, and thus the heated moisture on the material can be removed by spin-drying.

Next, according to the third aspect of the present invention, the generation of foam in the washing solution circulating system can be effectively suppressed or prevented. Several examples thereof will now be illustrated with reference to FIG. 9 to 20.

Figure 9:
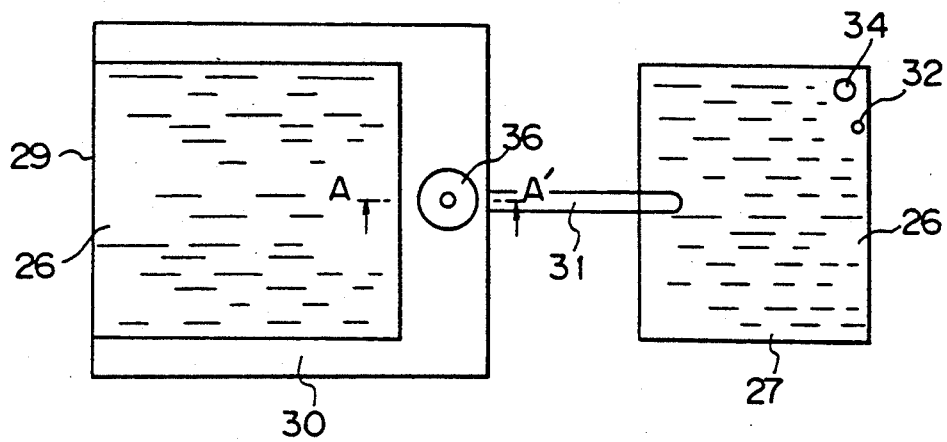
FIG. 9 is a drawing illustrating one example of a foam-suppressing device according to the present invention.
Figure 10:
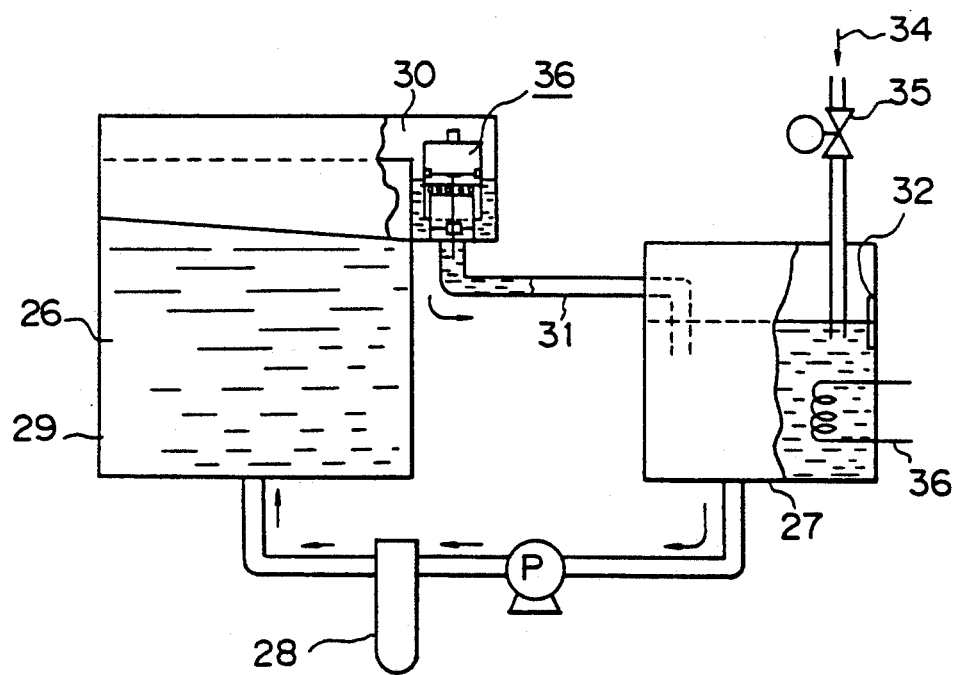
FIGS. 10 to 20 are drawings illustrating other examples of the foam-suppressing devices according to the present invention.

As shown in FIGS. 9 and 10, according to the present invention, a foam-suppressing means 36 is placed in a washing solution overflow vessel 30 in the circulating system of the washing solution 26 shown in FIG. 8. Various means 36 are shown in FIGS. 11-21.

Figure 11:
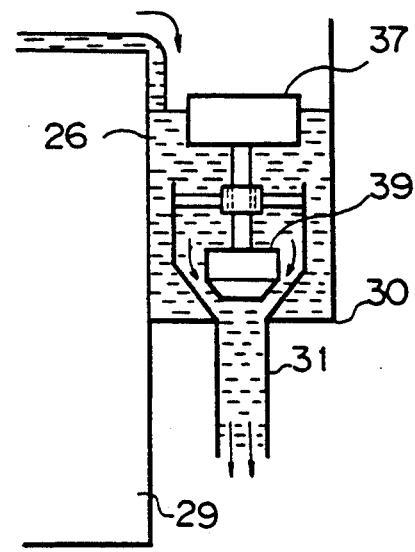
Figure 12:
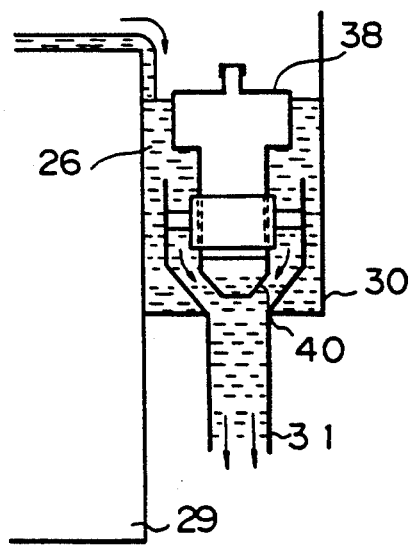

For example, in the embodiments shown in FIGS. 11 and 12, a foam-suppressing apparatus comprises, in a system for circulating a washing solution, a washing solution overflow vessel 30 capable of storing the solution and a valve 39 or 40 which is opened and closed by the buoyancy force exerted on a float 37 or 38; the valve 39 or 40 opening and closing at the water level in the overflow vessel 30 at which an exhaust drain 31 for the solution does not entrap air.

In the foam-suppressing apparatus shown in FIGS. 11 and 12, the valve 39 or 40 is floated at a level at which the amount of the circulated solution entering the overflow vessel 30 is balanced by the flow rate thereof drained through the valve.

Figure 13:
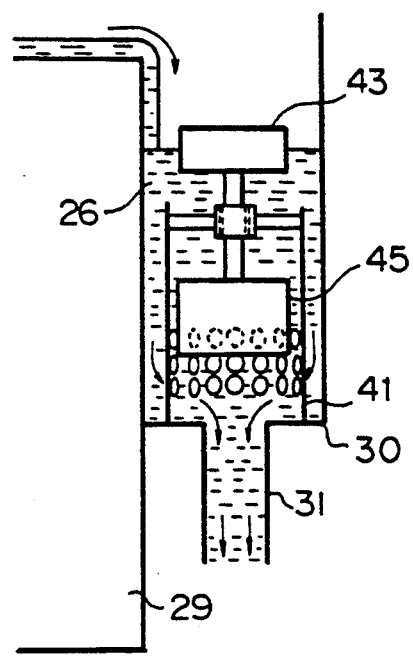
Figure 14:
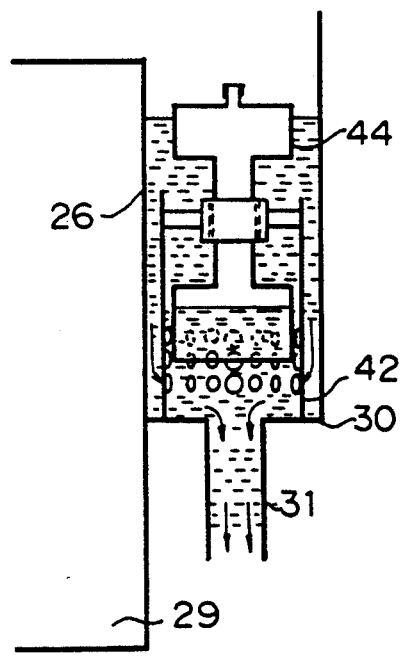

A foam-suppressing apparatus shown in FIGS. 13 and 14 comprises, in a system for circulation a washing solution, an overflow vessel 30 capable of storing the solution, an outer cylinder 41 or 42 connected to an exhaust drain 31 and having a hole through which the solution can enter the cylinder, and an internal, or inner, cylinder 45 or 44 which opens and closes the hole of the outer cylinder 41 or 42 by the buoyancy force exerted on a float 43 or 44; the hole of the outer cylinder 41 or 42 being opened and closed at the water level in the overflow vessel 30 at which the exhaust drain 31 for the solution does not entrap air. The internal cylinder 45 or 44 is floated at a level at which the amount of the circulated solution entering the overflow vessel 30 is balanced by the flow rate thereof drained through the hole of the outer cylinder 41 or 42.

Note, that the sizes of the holes in the outer cylinder (or sometimes, the inner cylinder) in various embodiments of the present invention can be any size such that the liquid amount overflowing from the overflow vessel 30 can be satisfactorily withdrawn therefrom.

Figure 15:
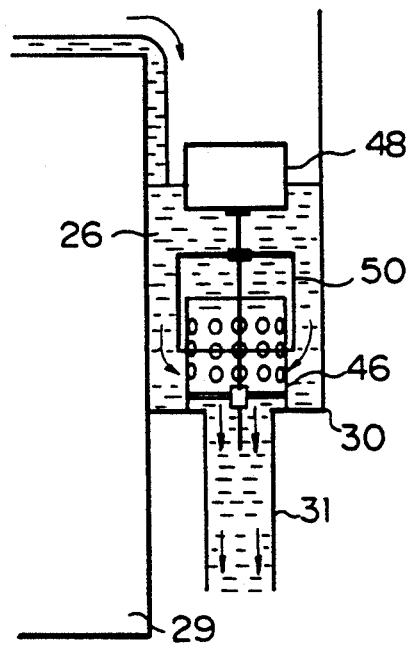
Figure 16:
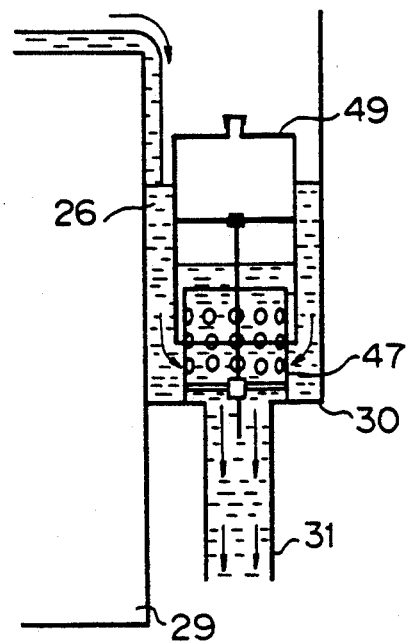

A foam-suppressing apparatus shown in FIGS. 15 and 16 comprises, in a system for circulating a solution, an overflow vessel 30 capable of storing the solution, an internal cylinder 46 or 47 connected to an exhaust drain 31 and having a hole through which the solution can enter the cylinder and an outer cylinder 50 or 49 which opens and closes the hole of the internal cylinder 46 or 47 by the buoyancy force exerted on a float 48 or 49, the hole of the internal cylinder 46 or 47 being opened and closed at the water level in the overflow vessel 30 at which the exhaust drain 31 for the washing solution does not entrap air. The outer cylinder 50 or 49 is floated at a level at which the amount of the circulating washing solution entering the overflow vessel 30 is balanced by the flow rate thereof drained through the hole of the internal cylinder 46 or 47.

Figure 17:
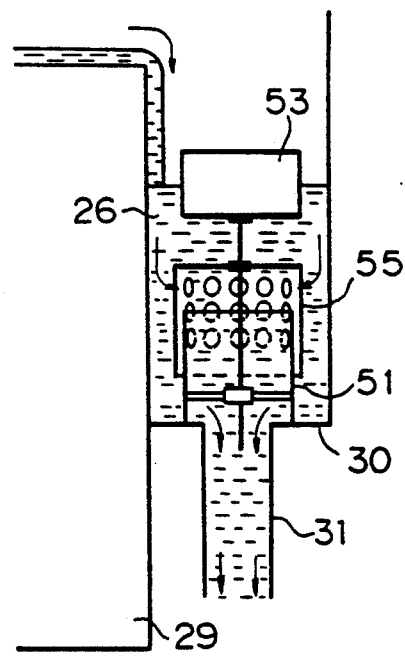
Figure 18:
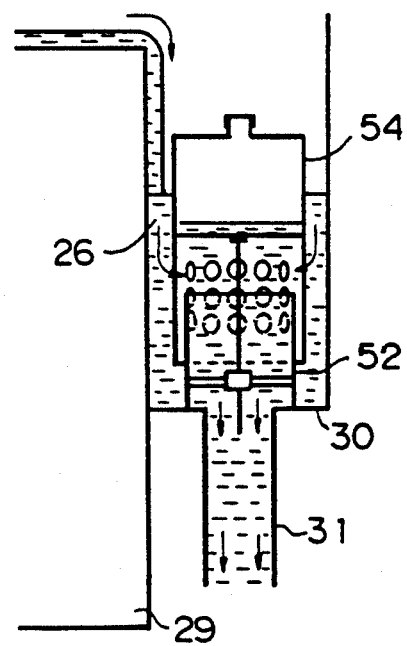

A foam-suppressing apparatus shown in FIGS. 17 and 18 comprises, in a system for circulating a washing solution, an overflow vessel 30 capable of storing the washing solution, an internal cylinder 51 or 52 connected to an exhaust drain 31 and an outer cylinder 55 or 54 having a hole through which the washing solution can enter the cylinder and in which the hole of the outer cylinder is opened and closed by the buoyancy force exerted on a float 53 or 54, the hole of the outer cylinder 55 or 54 being opened and closed at the water level in the overflow vessel 30 at which the exhaust drain 31 for the washing solution does not entrap air. The outer cylinder 55 or 54 is floated at a level at which the amount of the circulated solution entering the overflow vessel 30 is balanced by the flow rate thereof drained through the hole of the outer cylinder 55 or 54.

Figure 19:
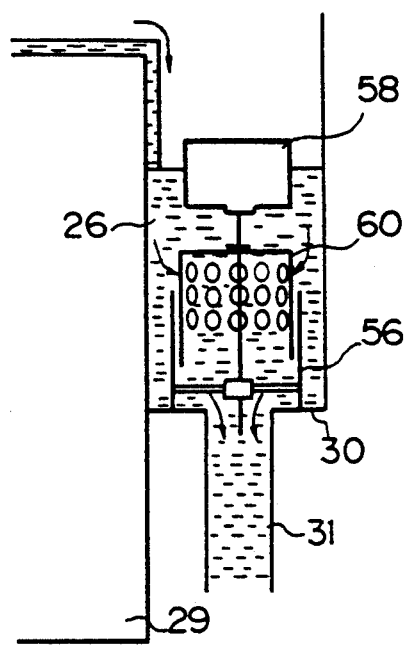
Figure 20:
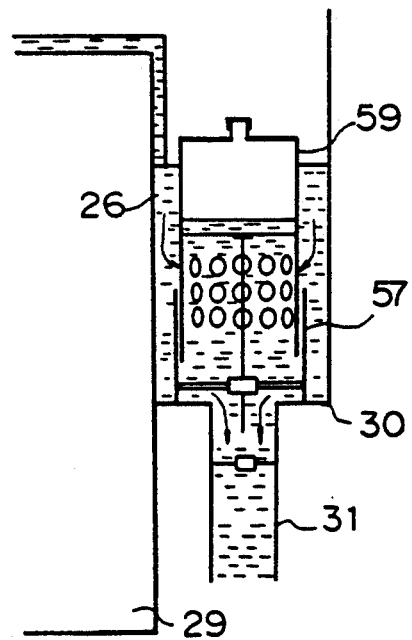

A foam-suppressing apparatus shown in FIGS. 19 and 20 comprises, in a system for circulating a solution, an overflow vessel 30 capable of storing the washing solution, an outer cylinder 56 or 57 connected to an exhaust drain 31 and an internal cylinder 60 or 59 having a hole through which the solution can enter the cylinder and in which the hole of the internal cylinder is opened and closed by the buoyancy force exerted on a float 58 or 59; the hole of the internal cylinder 60 or 59 being opened and closed at the water level in the overflow vessel 30 at which the exhaust drain 31 for the solution does not entrap air. The internal cylinder 60 or 59 is floated at a level at which the amount of the circulating washing solution entering the overflow vessel 30 is balanced by the flow rate thereof drained through the hole of the internal cylinder 60 or 59.

Each of the above-mentioned floats has a cavity therein and a means for exhausting the air from the cavity at the upper portion thereof, so that the buoyancy force can be controlled by introducing the washing solution into the float.

Furthermore, the shapes of the above-mentioned internal and outer cylinders may be, in addition to a circle, any desired cross-sectional shape such as a triangle, square and polygonal.

The preferable washing/drying apparatus according to the present invention will now be explained with reference to a block diagram flow chart of FIG. 21, although the present invention is by no means limited thereto.

Figure 21:
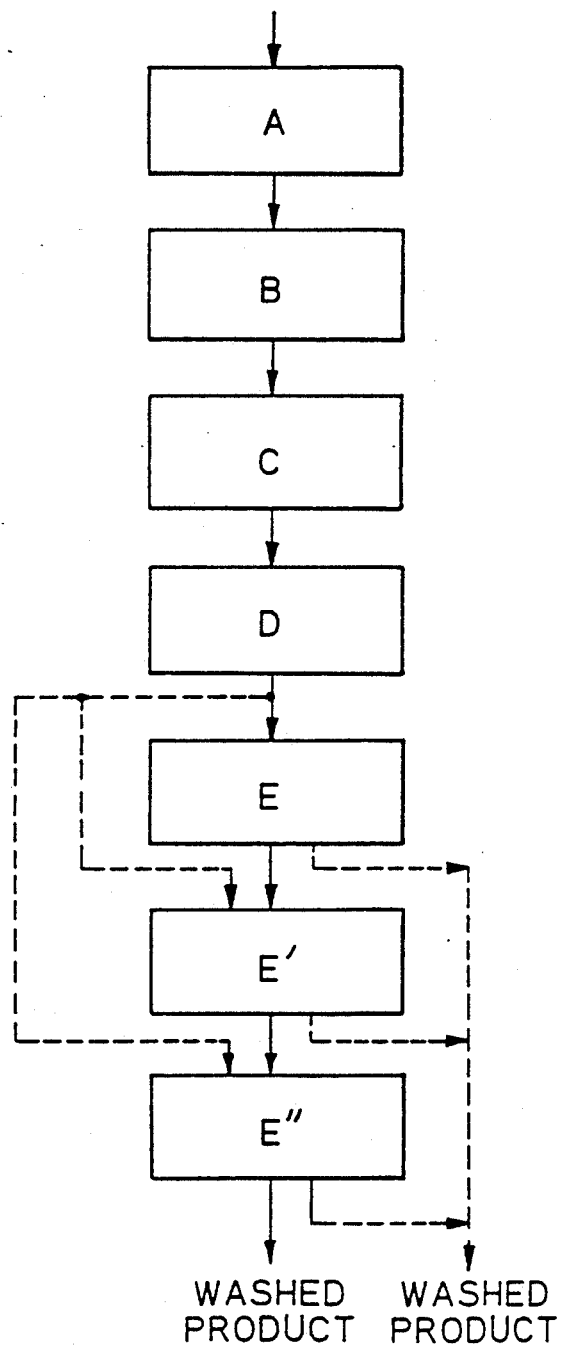
FIGS. 21 is a diagram illustrating the preferable steps of the washing/drying method and apparatus according to the present invention.

In FIG. 21, A is a ultrasonic washing vessel, B a first shower washing vessel, C a dip bubbling vessel, D a second shower washing vessel, and E, E' and E" first, second, and third vacuum drying vessels, respectively.

According to the present invention, the materials/or articles contained in, for example, a basket, are conveyed by an appropriate conveying means from the ultrasonic washing vessel A to the vacuum drying vessels E, E' and E". The materials to be washed are first dipped in the ultrasonic washing vessel A through which an aqueous washing solution of a fluorine type surfactant is circulated, while the materials to be washed are subjected to a ultrasonic treatment under the conditions of, for example, 60° C.×60 sec. Then, the materials to be washed are conveyed to the first shower washing vessel B in which the materials are rinsed by spraying pure water thereon at, for example, 40° C. for 60 seconds. At this stage, a layer of substantially one molecule is formed on the surfaces of the materials to be washed. The materials are then dipped in pure water in the dip bubbling vessel C at 40° C. for 60 seconds, while clean air is bubbled, whereby the forming of a one mole layer of the surfactant is ensured even in sinks, blind tap holes or the like, and the materials are further sprayed and washed with pure water at, for example, 40° C. for 60 seconds.

The materials to be washed having a one molecular layer of a fluorine type surfactant on the surfaces thereof are, for example, then: (1) heated with a low temperature steam (e.g., 90° C.) under, for example, 40 mmHg, (2) subjected to hot air blowing at 90° C. under an atmospheric pressure, and (3) then subjected to vacuum drying under 40 mmHg. According to the present invention, the above-mentioned drying steps (1), (2) and (3) can be effected in series in the vacuum drying vessels E, E' and E'', respectively, as shown by the solid line in FIG. 21, but according to a further preferable embodiment of the present invention, all of the drying steps (1), (2) and (3) are effected in each vacuum vessel of E, E' and E'', as shown by corresponding dotted line paths of FIG. 21. The preferable drying time is 3 to 6 minutes, whereby the desired through washing and drying can be accomplished.

As described above, according to the present invention, by carrying out a washing treatment by dipping a material to be washed in an aqueous solution of a water repellent surfactant, or dipping a material to be washed, which has been first washed in another step, in an aqueous solution of a water repellent surfactant, at least one molecular layer of the water repellent surfactant is attached to the surface of the material to be washed. As a result, due to the water repellent effect of the surface of the material to be washed, water is repelled and formed into beads, whereby a thorough washing and drying after washing can be carried out efficiently without the use of a fluorocarbon and without adverse affects on the material to be washed.

Also, by placing the material to be washed in a vacuum chamber, heating with steam in an atmosphere having a reduced pressure at which the boiling point of water is controlled to a temperature of 100° C. or less, preferably 99° C. or lower, more preferably 80° C. to 95° C., or air blowing hot air after the steam heating, followed by vacuum aspiration, even an article having a complicated shape, which is difficult to completely dry, can be fully and rapidly dried.

Further, according to the drying apparatus of the present invention, the materials, especially those susceptible to heat, can be effectively dried after washing with water without an adverse affect due to heat.

Furthermore, according to the foam-suppressing apparatus of the present invention, the generation of foam in the system can be effectively suppressed or prevented by controlling the level of the washing solution in the overflow vessel for the washing vessel, so that air is not entrapped in the washing solution effluent in the washing solution circulating system.

We claim:

1. A washing/drying method, comprising:
   dipping material to be washed into an aqueous solution containing at least one surfactant having a water repellency selected from the group consisting of hydrocarbon surfactants having a $C_{12}$–$C_{18}$ hydrophobic alkyl group, fluorine surfactants having a $C_6$–$C_{12}$ fluorinated alkyl group, and hydrophobic silicon surfactants so that at least one molecular layer of the water repellent surfactant is attached to the surface of the material to be washed, and then
   drying the material by at least one of vacuum drying, shaking off, blowing gas thereon, and heating.

2. A washing/drying method as claimed in claim 1, further comprising heating the material after the water repellent treatment with stream at a temperature of less than 100° C. in an atmosphere having a reduced pressure such that, in the reduced pressure atmosphere, the boiling point of water becomes less than 100° C., prior followed by the drying of the material.

3. A method as claimed in claim 1, wherein said surfactant is selected from the group consisting of anionic perfluoroalkyl carboxylates having a $C_6$–$C_{12}$ fluorinated alkyl group and anionic perfluoroalkyl phosphates having a $C_6$–$C_{12}$ fluorinated alkyl group.

4. A washing/drying method comprising:
   dipping a material to be washed into an aqueous solution containing a surfactant having a water repellency selected from the group consisting of hydrocarbon surfactants having a $C_{12}$–$C_{18}$ hydrophobic alkyl group, fluorine surfactants having a $C_6$–$C_{12}$ fluorinated alkyl group, and hydrophobic silicon surfactants so that at least one molecular layer of the water repellent surfactant is attached to the surface of the material to be washed,
   heating the material to be washed with steam at a temperature of less than 100° C. in an atmosphere having a reduced pressure such that, in the reduced pressure atmosphere, the boiling point of water becomes less than 100° C., and
   drying the material by at least one of vacuum drying, shaking off, blowing gas thereon, and heating.

5. A method as claimed in claim 4, wherein said surfactant is selected from the group consisting of anionic perfluoroalkyl carboxylates having a $C_6$–$C_{12}$ fluorinated alkyl group and anionic perfluoroalkyl phosphates having a $C_6$–$C_{12}$ fluorinated alkyl group.

6. A washing/drying method comprising:
   washing a material to be washed with an aqueous solution not containing a surfactant having a water repellency,
   placing the washed material in a vacuum chamber,
   heating the material to be washed with steam at a temperature of less than 100° C. in an atmosphere having a reduced pressure such that, in the reduced pressure atmosphere, the boiling point of water is less than 100° C.,
   subsequently blowing a gas into the material, and thereafter,
   vacuum drying the material.

* * * * *

UNITED STATES PATENT AND TRADEMARK OFFICE
CERTIFICATE OF CORRECTION

PATENT NO. : 5,203,927

DATED : April 20, 1993

INVENTOR(S) : Ichiro YOSHIDA et al.

It is certified that error appears in the above-identified patent and that said Letters Patent is hereby corrected as shown below:

Title Page, under [75] Inventors, second line, "Kawaashima" should be --Kawashima--.

Title Page, second column, Assistant Examiner, "Saeed T. Chandhry" should be --Saeed T. Chaudhry--.

Column 1, line 43, "flourocarbon" should be --fluorocarbons--.

Column 1, line 44, "fluorocarbons" should be --fluorocarbon--.

Column 1, line 64, after "washing" delete ",".

Column 1, line 65, after "washing" insert --,--.

Column 2, line 12, "," should be --:--.

Column 2, line 18, after "95°C." insert --,--.

Column 2, line 27, after "95°C." insert --,--.

Column 3, line 7, after "washing" insert --and--.

Column 3, line 10, delete ",".

Column 3, line 47, "Figs." should be --Fig.--.

Column 5, line 50, "cases" should be --causes--.

Column 6, line 39, "D" should be --P--.

Column 8, line 31, before "heating" insert --and--; after "heating" insert --,--; and after "ease" insert --,--.

Column 8, line 30, delete "and"

UNITED STATES PATENT AND TRADEMARK OFFICE
CERTIFICATE OF CORRECTION

PATENT NO. : 5,203,927
DATED : April 20, 1993
INVENTOR(S) : Ichiro YOSHIDA et al.

It is certified that error appears in the above-identified patent and that said Letters Patent is hereby corrected as shown below:

Column 10, line 27, after "water" delete ",".

Column 10, line 28, after "thereon" insert --,--.

Column 13, line 27, after "drying" insert --,--.

Column 17, line 41, after "attempted" insert --,--.

Column 20, line 44, after "shape" insert --,--.

Column 20, line 48, after "diagram" insert --/--.

Column 22, line 19, delete "prior".

Signed and Sealed this

Twenty-second Day of March, 1994

Attest:

BRUCE LEHMAN

*Attesting Officer*   *Commissioner of Patents and Trademarks*